United States Patent
Daibo

(10) Patent No.: US 10,062,488 B2
(45) Date of Patent: Aug. 28, 2018

(54) SUPERCONDUCTING CURRENT LEAD, SUPERCONDUCTING CURRENT LEAD DEVICE, AND SUPERCONDUCTING MAGNET DEVICE

(71) Applicant: FUJIKURA LTD., Koto-ku, Tokyo (JP)

(72) Inventor: Masanori Daibo, Sakura (JP)

(73) Assignee: FUJIKURA LTD., Koto-ku, Tokyo (JP)

( * ) Notice: Subject to any disclaimer, the term of this patent is extended or adjusted under 35 U.S.C. 154(b) by 877 days.

(21) Appl. No.: 14/465,178

(22) Filed: Aug. 21, 2014

(65) Prior Publication Data

US 2016/0322145 A1    Nov. 3, 2016

Related U.S. Application Data

(63) Continuation of application No. PCT/JP2013/054713, filed on Feb. 25, 2013.

(30) Foreign Application Priority Data

Feb. 23, 2012    (JP) .................................. 2012-037658

(51) Int. Cl.
*H01F 6/06* (2006.01)
*H01B 12/06* (2006.01)
(Continued)

(52) U.S. Cl.
CPC .............. *H01F 6/065* (2013.01); *H01B 12/06* (2013.01); *H01F 6/04* (2013.01); *H01L 39/126* (2013.01); *H01L 39/143* (2013.01); *H01R 4/68* (2013.01)

(58) Field of Classification Search
CPC ............ H01F 6/06; H01F 6/065; H01B 12/06
See application file for complete search history.

(56) References Cited

U.S. PATENT DOCUMENTS 5,114,908 A    5/1992    Sato et al.
5,248,851 A    9/1993    Chason et al.
(Continued)

FOREIGN PATENT DOCUMENTS

EP    0412442 A2    2/1991
JP    03-071518 A    3/1991
(Continued)

OTHER PUBLICATIONS

Amemiya et al., "Transport losses in single and assembled coated conductors with textured-metal substrate with reduced magnetism", Physica C 468 (2008), pp. 1718-1722.
(Continued)

*Primary Examiner* — Ramon M Barrera
(74) *Attorney, Agent, or Firm* — Sughrue Mion, PLLC

(57) ABSTRACT

A superconducting current lead supplying current to a superconducting device includes a plurality of electrode members, a support rod that is arranged between the plurality of electrode members so as to connect the plurality of electrode members each other, and a plurality of thin multi-layer rare-earth-based superconducting wires, each of which has a tape shape and includes a main surface and both end portions being connected to each of the plurality of electrode members, and each of which is arranged on an outer surface of the support rod, wherein an angle θ is 40-60 degrees that is formed by each of the main surfaces adjacent to each other in a circumferential direction of the support rod on the outer surface of the support rod.

4 Claims, 9 Drawing Sheets

(51) Int. Cl.
  *H01L 39/14* (2006.01)
  *H01R 4/68* (2006.01)
  *H01F 6/04* (2006.01)
  *H01L 39/12* (2006.01)

(56) References Cited

U.S. PATENT DOCUMENTS

| | | | |
|---|---|---|---|
| 5,276,281 A | | 1/1994 | Sato et al. |
| 5,742,217 A | * | 4/1998 | Bent ............... H01F 6/065 335/216 |
| 2006/0073979 A1 | | 4/2006 | Thieme et al. |
| 2011/0244234 A1 | * | 10/2011 | Taneda ............ C23C 14/024 428/375 |
| 2013/0040819 A1 | | 2/2013 | Haraguchi et al. |

FOREIGN PATENT DOCUMENTS

| | | | | |
|---|---|---|---|---|
| JP | 4218215 A | | 8/1992 | |
| JP | 05-028850 A | | 2/1993 | |
| JP | 05-081941 A | | 4/1993 | |
| JP | 07-073759 A | * | 3/1995 | ............ H01B 13/00 |
| JP | 2003-505848 A | | 2/2003 | |
| JP | 2009503794 A | | 1/2009 | |
| JP | 2009-230912 A | | 10/2009 | |
| JP | 2009-230913 A | | 10/2009 | |
| JP | 2010176892 A | * | 8/2010 | |
| JP | 2011003468 A | | 1/2011 | |
| JP | 2011-171090 A | | 9/2011 | |
| JP | 2012-028041 A | | 2/2012 | |
| WO | 01/08234 A2 | | 2/2001 | |
| WO | 2007016492 A2 | | 2/2007 | |
| WO | 2011/129245 A1 | | 10/2011 | |
| WO | 2011/129252 A1 | | 10/2011 | |

OTHER PUBLICATIONS

Ogawa et al., "Experimental Evaluation of the Effect on AC Loss of a Polygonal Arrangement in YBCO Assembled Conductors", IEEE Transactions on Applied Superconductivity, vol. 21, No. 3, Jun. 2011, pp. 3285-3288.
Communication dated Sep. 10, 2015 from the European Patent Office issued in corresponding European application No. 13751882.5.
Ma et al., "AC loss characteristics of a hex-cable in an azimuthal external AC magnetic field", Physica C 469 (2009), pp. 1722-1725.
Communication dated Nov. 11, 2014, issued by the Japan Patent Office in corresponding Japanese Application No. 2014-500970.
International Search Report of PCT/JP2013/054713 dated May 7, 2013.
Machine Translation of JP2011171090A of record (Aug. 21, 2014).
Machine Translation of JPH05081941A of record (Aug. 21, 2014).
Machine Translation of JPH05028850A of record (Aug. 21, 2014).
Machine Translation of JP2012028041A of record (Aug. 21, 2014).
Communication dated Mar. 3, 2015, issued by the Japanese Patent Office in counterpart Application No. 2014500970.
Communication dated Apr. 12, 2017, issued from the Europe Patent Office in counterpart European Patent Application No. 13751882.5.
Communication dated Jan. 16, 2018, from the European Patent Office in counterpart application No. 13751882.5.

* cited by examiner

SUPERCONDUCTING CURRENT LEAD, SUPERCONDUCTING CURRENT LEAD DEVICE, AND SUPERCONDUCTING MAGNET DEVICE

CROSS REFERENCE TO RELATED APPLICATIONS

This application is a continuation application based on a PCT Patent Application No. PCT/JP2013/054713, filed Feb. 25, 2013, whose priority is claimed on Japanese Patent Application No. 2012-037658 filed Feb. 23, 2012, the entire content of which are hereby incorporated by reference.

BACKGROUND OF THE INVENTION

Field of the Invention

The present invention relates to a superconducting current lead, a superconducting current lead device, and a superconducting magnet device.

Description of the Related Art

When a superconducting applied device such as a superconducting magnet is active, the superconducting magnet needs to be cooled. As a cooling method, a method that immersing the magnet into refrigerant such as liquid helium and liquid nitrogen (i.e., an immersion cooling type) and a method utilizing heat conduction from a refrigerator or a refrigerant (i.e., a conduction cooling type) are known.

In order to generate a magnetic field by using a cooled superconducting magnet, the superconducting coil needs to be excited up. Therefore, a current lead is used in order to supply current to a superconducting magnet from a power source.

A current lead is constituted by a conductor and formed of a good conductor such as Cu with low electric resistance. A good conductor has large thermal conductivity, and thus, heat penetration from an exterior increases. In addition, since Joule heat is generated in the current lead, a cooling efficiency of a superconducting magnet deteriorates by the Joule heat.

The cooling efficiency directly influences the cooling cost (i.e., electricity usage in a case of a refrigerator). Therefore, in particular, in a case of a conduction cooling type using a refrigerator, a current lead using a superconductor instead of the good conductor described above may be applied.

When an oxide superconductor is used as the superconductor, since electric resistance is zero, theoretically, Joule heat is not generated. In addition, an oxide superconducting layer has low thermal conductivity since the layer is formed of ceramic. As a result, a desirable current lead in which heat penetration from an exterior can be suppressed and Joule heat at a lead portion is reduced can be structured.

Conventionally, as the current lead described above, a superconducting current lead including an oxide superconductor bulk has been used. However, the oxide superconductor bulk has relatively weak mechanical strength, and thus, the usage is limited due to its fragility. On the other hand, a superconducting current lead using a Bi-based oxide superconducting wire, which is one kind of a high-temperature superconductor, is partially commercialized.

However, the Bi-based high-temperature superconductor requires a lot of wires since the critical current in a high-temperature magnetic field decreases due to a relation between the critical current and a magnetic field characteristic. In addition, the Bi-based high-temperature superconducting wire has a structure such that the high-temperature superconducting layer is covered with an Ag coating layer which is a good conductor. Therefore, an area ratio of the Ag coating layer is large, and a large amount of heat is introduced from an exterior due to heat conduction.

There is a current lead using an Y-based high-temperature superconducting wire having a favorable relation between the critical current and a magnetic field characteristic compared to that of the Bi-based high-temperature superconductor. As an example of application of such current lead, a structure of a current lead in order to suppress drift current and to prevent the current from not returning from a superconducting state (i.e., quench) is described in Japanese Unexamined Patent Application, First Publication No. 2009-230913.

Moreover, a structure of a current lead which has a non-inductive winding shape in order to reduce a decrease of the critical current due to a magnetic field in a superconducting wire is described in Japanese Unexamined Patent Application, First Publication No. 2009-230912.

In the structure of the current lead using the Y-based high-temperature superconducting wire having a favorable relation between the critical current and a magnetic field characteristic compared to that of the Bi-based high-temperature superconductor, when the current lead is applied to the superconducting magnet, the magnetic field is always applied to the current lead. In the superconducting wire, the critical current decreases based on the strength and the applied angle of the applied magnetic field. However, magnetic-field applied angle dependence in the Y-based high-temperature superconducting wire may vary based on the various fabricating methods, and sufficiently detailed data thereof is not available. Moreover, as a required characteristic of the current lead, it is not preferable that the critical current decreases with respect to a magnetic field in only a certain direction. As a measure, multiple Y-based high-temperature superconducting wires may be arranged with a small angle. However, when a lot of superconducting wires are provided, since a sum of areas of a stabilization layer in each of the superconducting wires increases, it is assumed that heat penetration from an exterior through the stabilization layer is not negligible.

SUMMARY OF THE INVENTION

The present invention has been achieved in view of the conventional circumstances as described above. In other words, there is provided a superconducting current lead, which includes a structure capable of preventing a decrease of critical current with respect to a magnetic field in a certain direction by using the small number of leads as possible, taking into consideration of magnetic-field applied angle dependence with respect to a current lead using high-temperature rare-earth-based superconducting wires. There is also provided a superconducting current lead device including the above current lead and a superconducting magnet device.

A first aspect of the present invention is a superconducting current lead supplying current to a superconducting device including a plurality of electrode members, a support rod that is arranged between the plurality of electrode members so as to connect the plurality of electrode members each other; and a plurality of thin multi-layer rare-earth-based superconducting wires, each of which includes a main surface and both end portions being connected to each of the plurality of electrode members, and each of which is arranged on an outer surface of the support rod and has a tape shape, where an angle $\theta$ is 40-60 degrees that is formed by each of the main surfaces adjacent to each other in a circumferential direction of the support rod on the outer surface of the support rod.

When the angle θ is within a range of 40-60 degrees that is formed by each of the main surfaces of the thin multi-layer rare-earth-based superconducting wires adjacent to each other in a circumferential direction of the support rod, even in the thin multi-layer rare-earth-based superconducting wires that depend on critical current corresponding to a magnetic field applied angle, at least one of the thin multi-layer rare-earth-based superconducting wires adjacent to each other in a circumferential direction of the support rod reliably presents high critical current. Therefore, the critical current of the superconducting current lead can be increased.

A second aspect of the present invention is that in the first aspect of the superconducting current lead as described above, a cross section of the support rod includes a multangular shape including three or more attachment surfaces on an outer circumferential of the support rod, and among the three or more attachment surfaces, each of the plurality of thin multi-layer rare-earth-based superconducting wires is arranged at two or more of the attachment surfaces.

When the thin multi-layer rare-earth-based superconducting wires are arranged along with the attachment surface of the support rod which has a multangular-shape cross-section, the thin multi-layer rare-earth-based superconducting wires adjacent to each other in a circumferential direction of the support rod can reliably be arranged within a range of 40-60 degrees. Therefore, even when critical current of at least one of the thin multi-layer rare-earth-based superconducting wires decreases corresponding to a direction of the magnetic field, at least one of the other adjacent rare-earth-based superconducting wires in a circumferential direction of the support rod has high critical current. As a result, the critical current of the superconducting current lead can be increased.

A third aspect of the present invention is that in the first aspect or the second aspect of the superconducting current lead, each of the plurality of thin multi-layer rare-earth-based superconducting wires may include a multi-layer structure in which an intermediate layer, an oxide superconducting layer, and an stabilization layer are laminated on a base material.

A fourth aspect of the present invention is that in the first aspect or the second aspect of the superconducting current lead, each of the plurality of thin multi-layer rare-earth-based superconducting wires may include, a laminated body in which a multi-layer structure in which an intermediate layer, an oxide superconducting layer, and a first stabilization layer are laminated on a base material, and a second stabilization layer which covers an entire surface of the laminated body.

When the above-described structure is employed as thin multi-layer rare-earth-based superconducting wires, the thin multi-layer rare-earth-based superconducting wires can be firmly attached to the support rod by soldering the stabilization layer and the support rod. In addition, since the thin multi-layer rare-earth-based superconducting wires include the stabilization layers, the superconducting characteristic thereof is stabilized.

A fifth aspect of the present invention is that in the fourth aspect of the superconducting current lead, the superconducting current lead further includes a solder layer which is filled between end edges of the second stabilization layer.

Therefore, the second stabilization layer can be preferably jointed.

A sixth aspect of the present invention is that in the third aspect of the superconducting current lead, each of the plurality of thin multi-layer rare-earth-based superconducting wires includes a laminate structure including a roll-tape member of Cu on the multi-layer structure, and further includes a metal layer which covers an entire surface of the laminate structure.

When the above-described structure is employed as thin multi-layer rare-earth-based superconducting wires, the superconducting layer can be protected as moisture intrusion is prevented, local heat divergence is promoted and the like. Therefore, the decrease of the superconducting characteristic of the thin multi-layer rare-earth-based superconducting wires can be prevented. As a result, the reliability of the superconducting current lead can be improved.

A seventh aspect of the present invention is that in the third aspect of the superconducting current lead, each of the plurality of thin multi-layer rare-earth-based superconducting wires comprises a laminate structure comprising a metal layer covering an entire surface of the multi-layer structure and a rolling-tape material of Cu on the metal layer, and further comprises a metal layer covering an entire surface of the laminate structure.

When the above-described structure is employed as thin multi-layer rare-earth-based superconducting wires, the superconducting layer can further be protected as moisture intrusion is prevented, local heat divergence is promoted and the like. Therefore, the decrease of the superconducting characteristic of the thin multi-layer rare-earth-based superconducting wires can be prevented. As a result, the reliability of the superconducting current lead can further be improved.

A eighth aspect of the present invention is that in any of the third to the seventh aspects of the superconducting current lead, each of the plurality of thin multi-layer rare-earth-based superconducting wires is arranged along with the attachment surface such that a distance between the base material and the attachment surface is greater than a distance between the first stabilization layer and the attachment surface.

When each of the plurality of thin multi-layer rare-earth-based superconducting wires is arranged as described above, critical current of the superconducting current lead can be increased and more stabilized.

A ninth aspect of the present invention is that in the third aspect of the superconducting current lead, each of the plurality of thin multi-layer rare-earth-based superconducting wires includes a structure in which two laminate structures are laminated and a metal layer which covers an entire surface of the structure, and in the laminate structure, an entire surface of the multi-layer structure is covered with a metal layer.

When the above-described structure is employed as thin multi-layer rare-earth-based superconducting wires, since two laminate structures which are capable of preventing the decrease of the superconducting characteristic are used, the superconducting characteristic of the wires is further stabilized. Therefore, the reliability of the superconducting current lead can be further improved.

A tenth aspect of the present invention is that in any of the third to the ninth aspects of superconducting current lead, at least on an outer surface of the metal layer or the second stabilization layer, a conductive splicing layer is formed.

Therefore, without separately forming another solder layer, it is possible to directly connect to the electrode terminals, and the attachment is easily performed.

An eleventh aspect of the present invention is a superconducting current lead device, the superconducting current lead according to any one of the third to the tenth aspects, wherein a first electrode member is connected to a first electrode terminal and a second electrode member is connected to a second electrode terminal; and an outer body attached to the first electrode terminal and the second electrode terminal and surrounding the superconducting current lead.

Since the outer body surrounding the superconducting current lead is provided, the thin multi-layer rare-earth-based superconducting wires can be covered. Therefore, the thin multi-layer rare-earth-based superconducting wires can be prevented from external force. In addition, since both of the electrode terminals can be spliced with the outer body, the superconducting current lead device with high mechanical strength can be provided.

A twelfth aspect of the present invention is a superconducting magnet device, including an outer container capable of reducing pressure, a low-temperature-site shield container arranged inside the outer container, a high-temperature superconducting coil accommodated inside the low-temperature-site shield container, a refrigerator attached to the outer container, and a superconducting current lead device according to the above-described fifth aspect arranged inside the outer container and supplying current from an external power source to the high-temperature superconducting coil.

According to the superconducting current lead device described above, the high-temperature superconducting coil can have a superconducting state by conduction cooling using the refrigerator. In addition, since the high-temperature superconducting coil is doubly-surrounded by the outer container and the low-temperature-site shield container, heat penetration from an exterior can be reduced. As a result, a temperature at which the superconducting state of the high-temperature superconducting coil is maintained can be obtained. Moreover, since the superconducting current lead device has a structure including the thin multi-layer rare-earth-based superconducting wires, current can be supplied in a loss-reduced state on a current supply path which is from the power source to the high-temperature superconducting coil.

According to the above-described aspects of the present invention, since a plurality of thin multi-layer rare-earth-based superconducting wires arranged to have an angle θ which is within a range of 40-60 degrees and is formed by each of the main surfaces are provided around the support rod, even in the thin multi-layer rare-earth-based superconducting wires that depend on critical current corresponding to a magnetic field applied angle, at least one of the thin multi-layer rare-earth-based superconducting wires adjacent to each other in a circumferential direction of the support rod reliably presents high critical current. Therefore, the superconducting current lead having an increased critical current can be obtained.

DETAILED DESCRIPTION OF THE PREFERRED EMBODIMENTS

Hereinbelow, a superconducting current lead according to the present invention is described with reference to the drawings.

Figure 1:
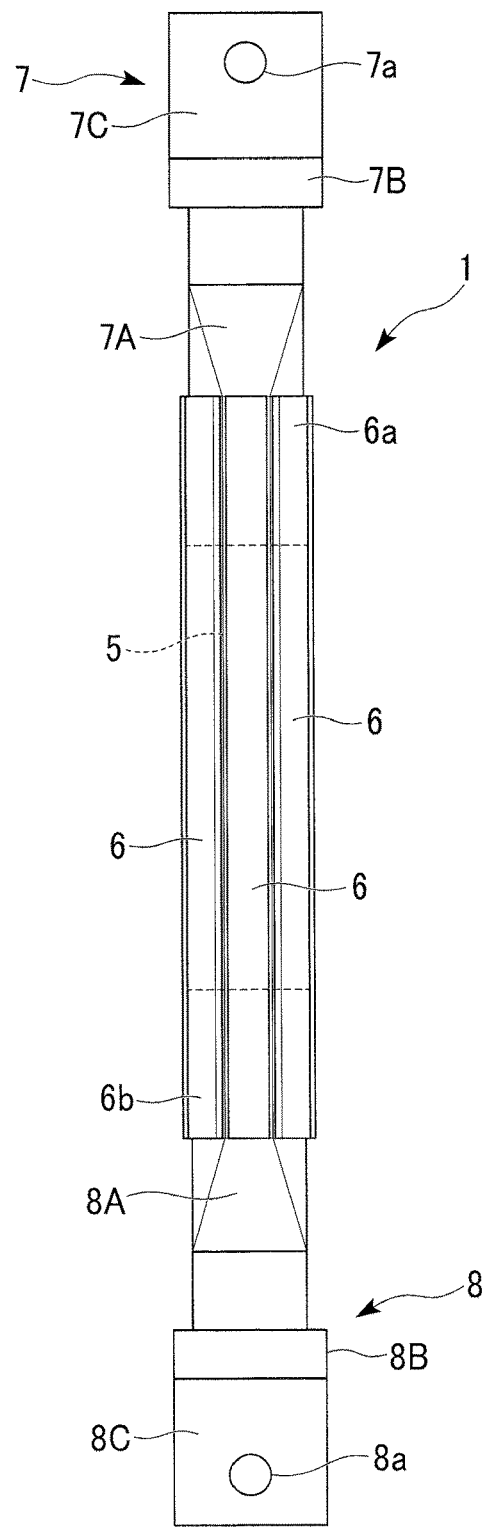
FIG. 1 is a plane view showing a superconducting current lead according to the first embodiment of the present invention.
Figure 2:
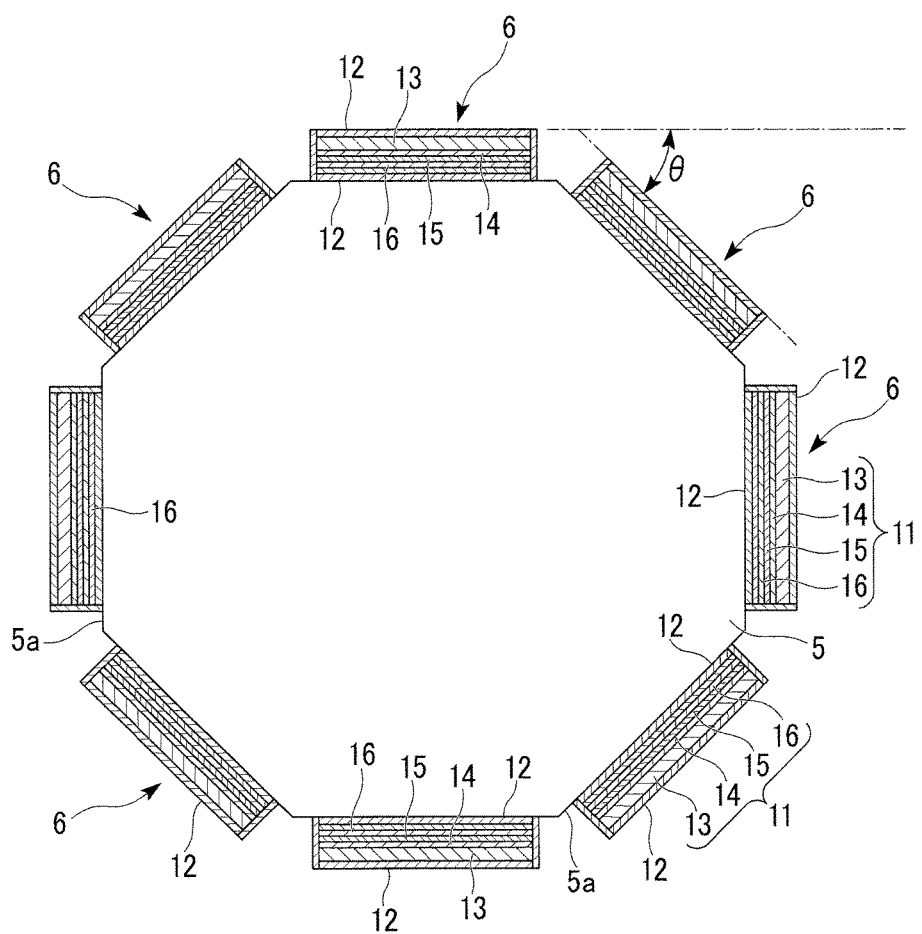
FIG. 2 is a cross-sectional view of a portion, which has thin multi-layer rare-earth-based superconducting wires, in the superconducting current lead shown in FIG. 1.
Figure 3:
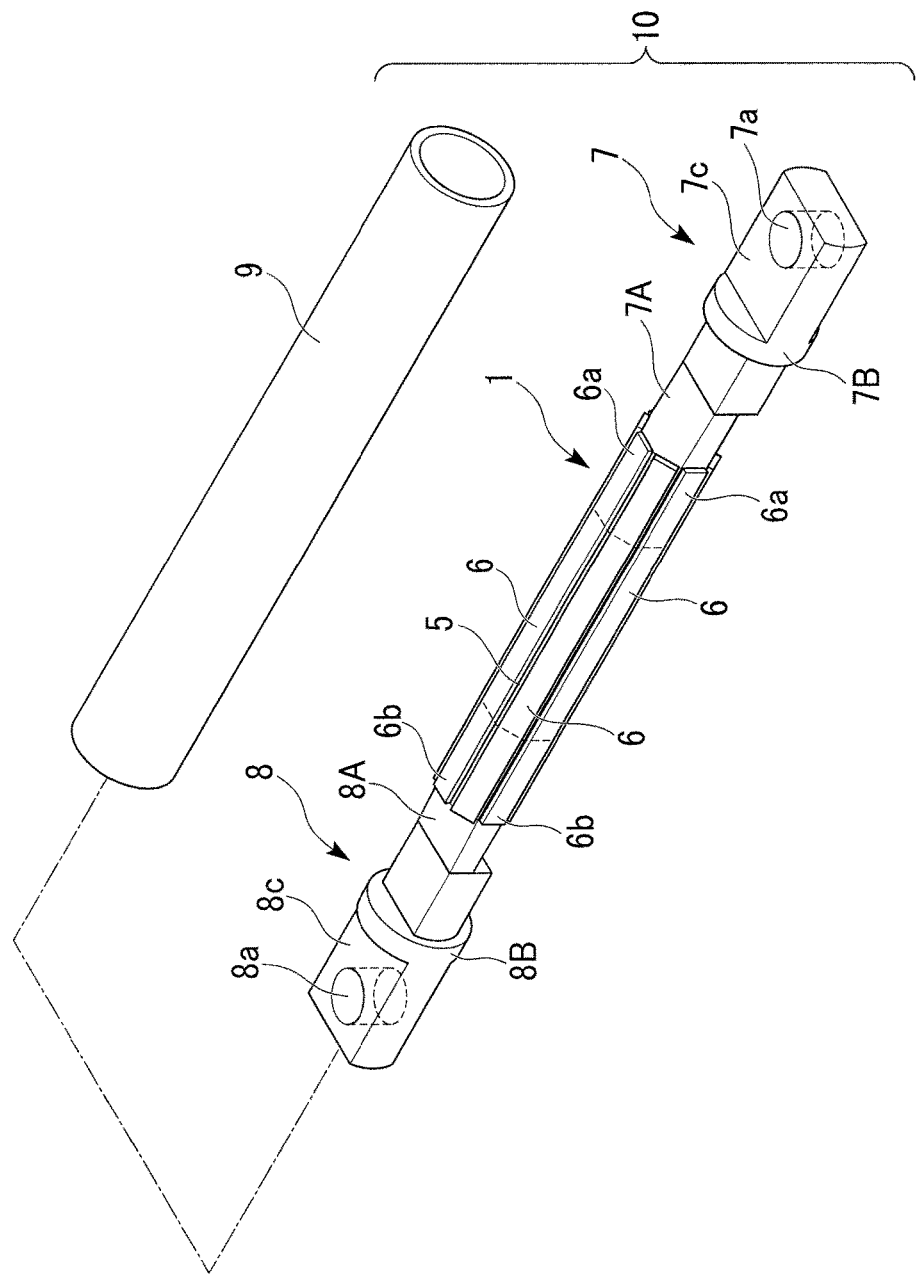
FIG. 3 is an exploded perspective view of the current lead device having the superconducting current lead shown in FIG. 1.

FIGS. 1-3 show the first embodiment of a superconducting current lead according to the present invention. A superconducting current lead 1 of the first embodiment includes a plate-like electrode terminal 7 at one end and a plate-like electrode terminal 8 at the other end. A rod-shape support rod 5 having a regular octagonal cross-section is formed between the electrode terminals 7 and 8 in order to uniformly connect electrode terminals 7 and 8. Along with the outer surface of the support rod 5, eight thin multi-layer rare-earth-based superconducting wires 6 are attached in parallel in a longitudinal direction of the support rod 5.

The electrode terminals 7 and 8 are plate-like terminal members made of a metallic material with preferable conductivity such as Cu or a Cu alloy, and a through-hole 7a used for connection is formed in the vicinity of a center portion of an end portion of the electrode terminal 7 and a through-hole 8a used for connection is formed in the vicinity of a center portion of an end portion of the electrode terminal 8. The support rod 5 which connects the electrode terminals 7 and 8 is preferably made of a metallic material with high strength and less heat penetration, for example, stainless steel, glass epoxy resin and the like in order to reduce heat penetration via the support rod 5 as possible. Each of the end portions of the support rod 5 is spliced with the electrode terminal 7 or 8 by a splicing method such as integration by welding, silver brazing, or structure fitting.

The cross-section of the support rod 5 is a regular octagon, and on the outer surface of the support rod 5, planar, long, and thin eight attachment surface 5a are formed. On each of the attachment surfaces 5a, a tape-shaped thin multi-layer rare-earth-based superconducting wire 6 is soldered such that one end (the first electrode member) 6a is spliced with one electrode terminal (the first electrode terminal) 7 and the other end (the second member) 6b is spliced with one electrode terminal (the second electrode terminal) 8.

An outer body 9 having a cylindrical shape shown in FIG. 3 is fitted from outside to the superconducting current lead 1 shown in FIG. 1, and then a superconducting current lead device 10 having a rod shape is formed. Here, FIG. 3 is an exploded perspective view showing a state that the outer body 9 is detached from superconducting current lead 1.

At the one end of the plate-like electrode terminal 7, a connection portion 7A which is bulged from the one end and has a regular octagonal cross-section is formed. The one end of the support rod 5 having a regular octagonal cross-section is spliced with a portion having a regular octagonal cross-section at a tip of the connection portion 7A.

The electrode terminal 7 includes a plate-like connection portion 7A connected to the support rod 5, a flange portion 7B formed with the other end of the connection portion 7A, and a terminal portion 7C extended from the flange portion 7B. Similar to the electrode terminal 7, the electrode terminal 8 includes a connection portion 8A, a flange portion 8B, and a terminal portion 8C.

A portion between the flange portion 7B and the flange portion 8B is covered with the outer body 9, and thus, as a whole, a rod-shape superconducting current lead device 10 is formed.

Figure 4:
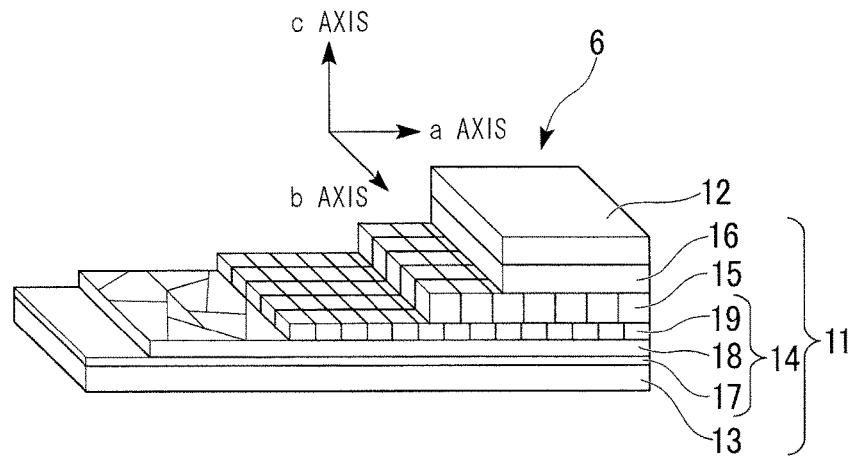
FIG. 4 is a partial cross-sectional perspective view showing one example of the thin multi-layer rare-earth-based superconducting wires provided with the superconducting current lead shown in FIG. 1.

The thin multi-layer rare-earth-based superconducting wire 6 is formed such that for example, as shown in a cross-sectional structure in FIG. 2, the entire surface of the tape-shaped oxidesuperconducting laminated body 11 is covered with a metal layer (the second stabilization layer) 12 made of a material with preferable conductivity such as Cu or a Cu alloy. In detail, the oxidesuperconducting laminated body 11 of the present embodiment is formed such that as shown in FIG. 4, an intermediate layer 14, an oxidesuperconducting layer 15, and a protection layer (the first stabilization layer) 16 are laminated on a tape-shaped base material 13 in this order. Note that in FIG. 4, the metal layer 12 which covers an entire surface of the oxidesuperconducting laminated body 11 is described in a simplified manner, and only a portion of the metal layer 12 that is laminated on a protection layer 15 is shown.

The base material 13 preferably has a tape-shape in order to serve as a flexible wire, and preferably includes a metal that has heat resistance. Among the various heat-resistant metals, nickel alloy is preferred. Among these, in the case of a commercialized product, Hastelloy (trade name registered to Hanes International of the U.S.) is preferred. The thickness of the base material 13 is generally 10-500 µm. In addition, an oriented Ni—W alloy tape-shaped base material obtained by introducing a texture into a nickel alloy or the like may be used as the base material 13.

As an example of an intermediate layer 14, a structure described below which includes an underlying layer 17, an orientation layer 18, and a cap layer 19 can be applied.

When the underlying layer 17 is provided, the underlying layer 17 can include a multi-layer structure of the diffusion prevention layer described below and the bed layer or a single-layer structure including either the diffusion prevention layer or the bed layer.

When the diffusion prevention layer is provided as an underlying layer 17, the diffusion prevention layer is preferably a single-layer structure or a multi-layer structure constituted from such as silicon nitride ($Si_3N_4$), aluminum oxide ($Al_2O_3$ or referred to as "alumina"), and GZO ($Gd_2Zr_2O_7$). The thickness of the diffusion prevention layer is for example, 10-400 nm.

When the bed layer is provided as the underlying layer 17, the bed layer is used to increase heat resistance, to reduce the interface reactivity, and to obtain orientation of the film disposed on the bed layer. Such bed layer is for example, rare-earth-based oxide such as yttria ($Y_2O_3$). In particular, $Er_2O_3$, $CeO_2$, $Dy_2O_3$, $Er_2O_3$, $Eu_2O_3$, $Ho_2O_3$, $La_2O_3$, and the like can be illustrated by an example, and a single-layer structure or a multi-layer structure formed by these materials can be used as the bed layer. The thickness of the bed layer is for example, 10-100 nm. In addition, since crystallinity of the diffusion prevention layer and the bed layer is not particularly significant, the layers may be formed by an ordinary film-forming method such as a sputtering method.

The orientation layer 18 functions as a buffer layer which controls crystalline orientation of the oxidesuperconducting layer 15 being formed on the orientation layer 18, and is preferably made of metal oxide having a favorable lattice matching characteristic with the oxidesuperconducting layer 15. As preferable materials of the orientation layer 18, particularly, metal oxide such as $Gd_2Zr_2O_7$, MgO, $ZrO_2$—$Y_2O_3$(YSZ), $SrTiO_3$, $CeO_2$, $Y_2O_3$, $Al_2O_3$, $Gd_2O_3$, $Zr_2O_3$, $Ho_2O_3$, and $Nd_2O_3$ can be illustrated. The orientation layer 18 may be either of a single layer structure or a multi-layer structure.

The orientation layer 18 can be deposited by a publicly known method for forming a thin oxide film such as a physical evaporation method like sputtering, vacuum evaporation, laser evaporation, electron-beam evaporation, and ion beam assisted deposition (hereinafter, simply referred to as IBAD), a chemical vapor deposition (CVD) method, a metal-organic deposition (MOD) method, or thermal spray. Among the methods described above, a metal oxide layer formed by an IBAD method is particularly preferable, since the metal oxide layer has high crystalline orientation and effectively controls crystalline orientation of the cap layer 19 and the oxidesuperconducting layer 15 on the orientation layer 18. The IBAD method orients crystal axes by irradiating an ion beam with a certain angle with respect to a deposition surface of the crystal when vapor deposition is performed.

Generally, an argon (Ar) ion beam is used as an ion beam. For example, the orientation layer including $Gd_2Zr_2O_7$, MgO, or $ZrO_2$—$Y_2O_3$(YSZ) is particularly preferable since a value of $\Delta\phi$ (full width at half maximum, FWHM) which is an index that indicates the degree of crystalline orientation in the IBAD method can be small.

The cap layer 19 is preferably formed by a process that crystal grains selectively grow in the lateral direction by being epitaxially grown on the surface of the orientation layer 18, and subsequently overgrown in the lateral direction. With such the cap layer 19, a higher in-plane orientation can be obtained than the orientation layer 18.

Provided the material of the cap layer 19 can exhibit the aforementioned functions, it is not particularly limited; however, detailed examples of preferred materials include $CeO_2$, $Y_2O_3$, $Al_2O_3$, $Gd_2O_3$, $Zr_2O_3$, $Ho_2O_3$, $Nd_2O_3$ and the like. When the material of the cap layer 19 is $CeO_2$, the cap layer 19 may include Ce-M-O-based oxide in which a portion of Ce in $CeO_2$ is substituted with another metal atom or metal ion.

The cap layer 19 can be formed by a pulsed laser deposition method (PLD method), a sputtering method and the like. The film-forming conditions of the $CeO_2$ layer by the PLD method are that the temperature of the base material is approximately 500-1000° C. and the film formation is performed in an oxygen-gas atmosphere with approximately 0.6-100 Pa. The thickness of the cap layer 19 of $CeO_2$ is preferably 50 nm or more, and is more preferably 100 nm or more in order to obtain sufficient orientation. In consideration of crystalline orientation, the thickness is preferably within the range of 50-5000 nm.

As the oxidesuperconducting layer 15, a thin film including a rare-earth-based high-temperature oxidesuperconductor having an ordinary known composition can be widely applied. For example, a material made of $REBa_2Cu_3O_y$, (where RE denotes a rare-earth-based element such as Y, La, Nd, Sm, Er, Gd and the like), particularly Y123 ($YBa_2Cu_3O_y$) or Gd123($GdBa_2Cu_3O_y$) is used. The thickness of the oxidesuperconducting layer 15 is approximately 0.5-5 μm, and it is preferable that the thickness of the oxidesuperconducting layer 15 is entirely uniform.

As a method of fabricating the oxidesuperconducting layer 15, vacuum evaporation, laser evaporation, chemical vapor deposition (CVD), metal-organic deposition (MOD) and the like can be used. Among these methods, laser evaporation is preferable.

The protection layer 16 formed so as to cover an upper surface of the oxidesuperconducting layer 15 is formed of Ag or an Ag alloy. The protection layer 16 is formed using a film-formation apparatus such as a DC sputtering apparatus or an RF sputtering apparatus, and the thickness thereof is approximately 1-30 μm. The protection layer 16 of the present embodiment is formed on an upper portion of the oxidesuperconducting layer 15 using a film-formation apparatus. However, since the film-formation is performed while the tape-shaped base material 13 travels inside a chamber of the film-formation apparatus, particles for the film-formation of the protection layer 16 wrap around both side surfaces and a rear surface of the base material 13. As a result, particles of constituent elements of the protection layer 16 are slightly deposited on both of the side surfaces and the rear surface.

If Ag particles wrap around and are deposited, a metal-plate layer is firmly attached to the side surfaces and a rear surface of the base material 13 made of Hastelloy which includes a nickel alloy. If Ag particles do not wrap around and are not deposited, it may not be possible to firmly attach the plate layer to the base material 13 made of Hastelloy which includes a nickel alloy sufficiently.

The metal layer 12 coated on an outer surface of the oxidesuperconducting laminated body 11 includes, for example, a metallic material with preferable conductivity. The metal layer 12 acts together with the protections layer 16 as a bypass through which the current is commuted when the oxide superconducting layer 15 transitions from a superconducting state to a non-superconducting state. The material that constitutes the metal layer 12 may be a material that has good electrical conductivity, and although not particularly limited, is preferably one that is comparatively low priced such as copper, brass (a Cu—Zn alloy), a Cu alloy such as a Cu—Ni alloy, Al or the like, and more preferably copper since it has high electrical conductivity among these and is inexpensive. The thickness of the metal layer 12 is not limited and suitably adjusted; however, the thickness is preferably 20-300 μm.

The thin multi-layer rare-earth-based superconducting wire 6 formed as described above is fixed to the support rod 5 such that the metal layer 12 arranged at an outer surface of the thin multi-layer rare-earth-based superconducting wire 6 is formed along with the attachment surface 5a. Here, the thin multi-layer rare-earth-based superconducting wire 6 is arranged such that a distance between the protection layer 16 and the attachment surface 5a of the support rod 5 is reduced. In other words, the thin multi-layer rare-earth-based superconducting wire 6 is arranged along with the attachment surface 5a of the support rod 5 such that a distance between the base material 13 and the attachment surface 5a of the support rod 5 is greater than the distance between the protection layer 16 and the attachment surface 5a of the support rod 5. In addition, in the tape-shaped thin multi-layer rare-earth-based superconducting wire 6, both ends in a longitudinal direction protrude with a certain length from both of the end portions in a longitudinal direction of the support rod 5 having a regular octagonal cross-section toward the electrode terminal 7 or the electrode terminal 8. In the protruded portion, a stabilization layer is solder-fixed to the electrode terminal 7 or the electrode terminal 8.

Based on the structure described above, since the stabilization layer is solder-fixed to the electrode terminal 7 or 8, connection resistance is reduced compared to the case where the stabilization layer is connected to the base material, and the amount of heat generation can be reduced.

The support rod 5 has a structure with a high heat cycle resistance by using a material having a linear expansion coefficient which is close to a linear expansion coefficient of a superconducting wire (a linear expansion coefficient thereof is close to the base material) such as stainless. Therefore, the reliability of the support rod 5 is improved.

Further in detail, the end portion 6a of the thin multi-layer rare-earth-based superconducting wire 6 is extended and soldered to a portion formed in a regular octagonal shape at a connection portion 7A of the electrode terminal 7. Similarly, the end portion 6b of the thin multi-layer rare-earth-based superconducting wire 6 is extended and soldered to a portion formed in a regular octagonal shape at a connection portion 8A of the electrode terminal 8.

In the present embodiment, as a material to fix the thin multi-layer rare-earth-based superconducting wire 6 to the electrode terminals 7 and 8, solder can be used. However, as a low-melting-point metal, a metal having a melting point within a range of 100-300° C., for example, Sn, a Sn alloy, In and the like can be used. When solder is used, any solder such as Sn—Pb, Pb—Sn—Sb, Sn—Pb—Bi, Bi—Sn, Sn—Cu, Sn—Pb—Cu, and Sn—Ag can be used.

Each of the tape-shaped thin multi-layer rare-earth-based superconducting wires 6 is arranged along with each side surface of the support rod 5 having a regular octagonal cross-section. Therefore, the angle θ, which is formed by each of the surfaces (main surfaces) of the rare-earth-based superconducting wires 6 with thin multi-layers adjacent to each other in a circumferential direction of the support rod 5, is 45 degree as shown in FIG. 2. Since the thin multi-layer rare-earth-based superconducting wire 6 has a tape-shape, the main surface and the oxidesuperconducting layer 15 are arranged in parallel.

Figure 5:
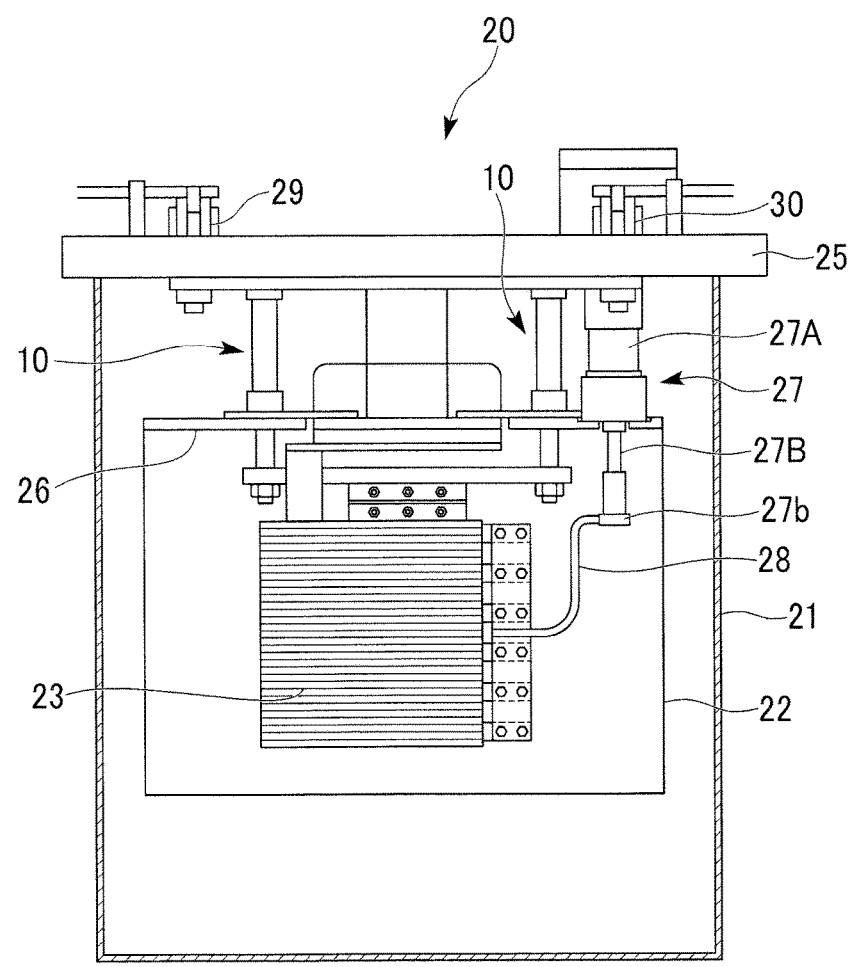
FIG. 5 is a cross-sectional view showing an example of a superconducting magnet device to which the superconducting current lead shown in FIG. 1 is applied.

The superconducting current lead device 10 having the structure described above is for example, applied to the superconducting magnet device 20 (the superconducting device) shown in FIG. 5.

The superconducting magnet device 20 shown in FIG. 5 is configured mainly by an outer container 21 which is capable of reducing the pressure such as a vacuum vessel, an inner container (a shield container at a low temperature side) 22 arranged at an inside of the outer container 21, a high-temperature superconducting coil 23 accommodated in the inner container 22, and a refrigerator 27 provided so as to penetrate a flange member 25 which closes an upper portion of the outer container 21 and a flange member 26 which closes an upper portion of the inner container 22. The refrigerator 27 has a two-stage structure including the first stage 27A and the second stage 27B, and the second stage 27B is extended toward inside the inner container 22. The high-temperature superconducting coil 23 is connected to a tip end portion 27b of the second stage 27B through a heat transfer member 28, and the high-temperature superconducting coil 23 can be cooled to the critical temperature or less by conduction cooling from the refrigerator 27. Generally, the high-temperature superconducting coil 23 has a structure that is made by consolidating the oxide superconducting wire and a bobbin which is not shown using an impregnation material such as a resin.

On the surface of the flange member 25, outer connection terminals 29 and 30 for supplying current are formed. The outer connection terminals 29 and 30 are extended so as to penetrate the flange member 25 and be drawn to an inside of the outer container 21, and the superconducting current lead devices 10 and 10 are embedded at the drawn portion so as to connect the flange member 25 and the flange member 26. Each of upper ends of the superconducting current lead devices 10 and 10 are connected to each of the outer connection terminals 29 and 30, and each of lower ends of the superconducting current lead devices 10 and 10 are connected to each of the oxide superconducting wires which is not shown and constitutes the high-temperature superconducting coil 23.

The outer container 21 is connected to a vacuum pump which is not shown, and thus, the inside thereof can be depressurized to a desirable vacuum degree. In addition, the connection terminals 29 and 30 are connected to an external power source which is not shown through the superconducting current lead wire. Therefore, the current is injected to the high-temperature superconducting coil 23 by the power source and a desirable magnetic field can be generated.

In the superconducting magnet device 20 shown in FIG. 5, by a vacuum pump which is not shown, the pressure of the inside of the outer container 21 is reduced and a vacuum state is realized, and the refrigerator 27 is operated to cool the high-temperature superconducting coil 23 to the critical temperature or less by conduction cooling. Then, the current is injected to the high-temperature superconducting coil 23 from the external power source through the connection terminals 29 and 30. The superconducting magnet device 20 is used as such. Although depending on the ability of the refrigerator 27, the refrigerator 27 can cool the high-temperature superconducting coil 23 to a low temperature which is lower than a liquid nitrogen temperature (77 K), such as 4.2 K, 20 K, or 40 K where the rare-earth-based oxidesuperconductor has a superconducting state. Therefore, the superconducting current lead 1 provided at an inside of the outer container 21 is also cooled to or under a critical temperature (preferably, 77 K or less).

The applied current flows from the connection terminals 29 and 30 to the oxide superconducting wire of the high-temperature superconducting coil 23 through the superconducting current lead 1 of the superconducting current lead device 10. In the superconducting current lead 1, when the electrode terminal 7 is supposedly arranged close to the connection terminal as a terminal being a high temperature, the current flows from the electrode terminal 7 to the thin multi-layer rare-earth-based superconducting wire 6. Then, the current flows to the electrode terminal 8 and reaches the oxide superconducting wire of the high-temperature superconducting coil 23. Here, since the superconducting current lead 1 is also cooled to the critical temperature or less, the resistance of eight oxidesuperconducting layers 15 each provided at the thin multi-layer rare-earth-based superconducting wires 6 becomes zero. Therefore, the current flows from the electrode member 2 to each oxidesuperconducting layer 15 through the solder layer, the metal layer 12, and the protection layer 16, and the current is injected to the electrode member 3. As a result, the high-temperature superconducting coil 23 needs to be excited up. Since the high-temperature superconducting coil 23 generates a magnetic field when the current is injected to the high-temperature superconducting coil 23, the superconducting magnet device 20 can generate a desired magnetic field.

Next, the operations and the effects of the superconducting current lead device 10 in which the thin multi-layer rare-earth-based superconducting wires 6 are arranged on an outer surface of the support rod 5 having a regular octagonal cross-section is described.

When the superconducting current lead device 10 having the structure described above is applied to the superconducting magnet device 20, the thin multi-layer rare-earth-based superconducting wire 6 has a tape shape and the oxidesuperconducting layer 15 has a planar shape. Therefore, the rare-earth-based oxidesuperconducting layer 15 has a characteristic that a critical current value is different depending on a magnetic field applied angle when a magnetic field is acted on a surface (a main surface) of the oxidesuperconducting layer 15.

For example, when the magnetic field applied angle is 40-60 degrees with respect to the surface (main surface) of the oxidesuperconducting layer 15, a value of critical current of the oxidesuperconducting layer 15 becomes approximately ½ times smaller. As shown in FIG. 2, however, eight tape-shaped oxidesuperconducting layers 15 provided around the support rod 5 are arranged such that the angle θ is 40-60 degrees that is formed by each of the main surfaces adjacent to each other in a circumferential direction of the support rod 5.

Therefore, when two particular thin multi-layer rare-earth-based superconducting wires 6 attached to an outer surface of the support rod 5 are described as an example, depending on the magnetic applied direction, among two of the oxidesuperconducting layers 15 of the thin multi-layer rare-earth-based superconducting wires 6, compared to one thin multi-layer rare-earth-based superconducting wire 6 with a lower critical current value, the other adjacent rare-earth-based superconducting wire with thin multi-layers 6 presents approximately a two-times higher critical current value.

In addition, depending on a direction of attaching the superconducting current lead device 10 to the superconducting magnet device 20, a magnetic-field acting direction with respect to the support rod 5 is different. When eight thin multi-layer rare-earth-based superconducting wires 6 are soldered to an outer surface of the support rod 5, the magnetic field acts on the superconducting current lead device 10 from an arbitrary direction. Therefore, even if a critical current value of any one of the thin multi-layer rare-earth-based superconducting wires 6 decreases, the other adjacent thin multi-layer rare-earth-based superconducting wire 6 presents more prominent critical current than the thin multi-layer rare-earth-based superconducting wire 6 having a lower critical current value. Therefore, the superconducting current lead 1 provides a prominent critical-current characteristic.

In addition, since the outer surface of the superconducting current lead 1 is covered with the outer bodies 9 and 9, when the superconducting current lead device 10 is attached to the superconducting magnet device 20, it is difficult to figure out a position in a circumferential direction. Assuming a structure including only one thin multi-layer rare-earth-based superconducting wire 6 on any of the side surfaces of the support rod 5, when the one thin multi-layer rare-earth-based superconducting wire 6 is arranged such that the magnetic field of the high-temperature superconducting coil 23 acts on a direction of 40-60 degrees with respect to the oxidesuperconducting layer 15, the critical current value of the one thin multi-layer rare-earth-based superconducting wire 6 drastically decreases, for example, to approximately a half of an original value.

In contrast, if the superconducting current lead 1 includes two or more such as eight number of thin multi-layer rare-earth-based superconducting wires 6 around the outer surface, the magnetic field of the high-temperature superconducting coil 23 acts on an arbitrary direction. Therefore, even if the critical current value of a specific one thin multi-layer rare-earth-based superconducting wires 6 decreases, the superconducting characteristic of other thin multi-layer rare-earth-based superconducting wires 6 does not decrease drastically. As a result, the superconducting current lead device 10 can obtain high critical current, and the favorable critical current characteristic can be obtained.

In the first embodiment shown in FIGS. 1-3, the example of the support rod 5 having a regular octagonal cross-section has been described. However, a shape of the cross-section of the support rod 5 may be either a multangular shape or a circular shape as long as the angle is within 40-60 degrees that is formed by the thin multi-layer rare-earth-based superconducting wires 6 adjacent in a circumferential direction. In addition, the number of thin multi-layer rare-earth-based superconducting wires 6 may be arbitrary as long as it is two or more. For example, the number can be arbitrarily selected between two to twelve. Moreover, it is not necessary to arrange the thin multi-layer rare-earth-based superconducting wires 6 around the entire surface of the support rod 5. For example, the arbitrary number such as two, three, four, five and the like of the thin multi-layer rare-earth-based superconducting wires 6 can be employed and attached to the support rod 5 having a regular octagonal cross-section. When a cross-section of the support rod 5 is a circular-shape, the outer surface of the support rod 5 is a curved surface. Therefore, when the tape-shaped thin multi-layer rare-earth-based superconducting wires 6 are arranged along with an outer surface in a longitudinal direction of the support rod 5, the thin multi-layer rare-earth-based superconducting wires 6 are arranged in the outer surface in a curved state. In this state, the angle being within 40-60 degrees that is formed by the thin multi-layer rare-earth-based superconducting wires 6 adjacent in a circumferential direction means that in other word, an angle is 40-60 degrees that is formed by tangents, each of the tangents passing through a center portion in a width direction at an upper surface of each of the thin multi-layer rare-earth-based superconducting wires 6 adjacent in a circumferential direction.

The number of the thin multi-layer rare-earth-based superconducting wires 6 attached to the support rod 5 may be selected as necessary corresponding to a current amount to be flown to the superconducting current lead device 10.

By employing the support rod 5 with a multangular shape, since the thin multi-layer rare-earth-based superconducting wires 6 can be attached without curving to plane surfaces of the support rod, distortion generated in the wires 6 can be reduced. Therefore, the support rod can be attached while deterioration of the wires 6 is reduced.

In addition, the thin multi-layer rare-earth-based superconducting wire 6 attached around the outer surface of the support rod 5 may be covered with a fixed material such as an epoxy resin, and each of outer surfaces of the thin multi-layer rare-earth-based superconducting wires 6 may be insulated by an insulating tape and the like. Moreover, in order to improve airtightness, instead of the metal layer 12 covering an outer surface of the thin multi-layer rare-earth-based superconducting wire 6, a structure, in which a copper rolling tape or an copper alloy is attached and fixed to the outer surface of the thin multi-layer rare-earth-based superconducting wire 6 by solder or tin, can be employed.

Figure 6A:
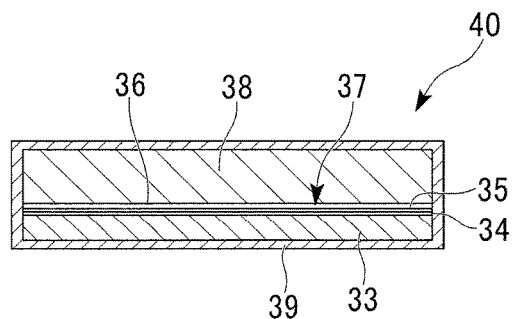
FIG. 6A is a partial cross-sectional view showing the second example of the thin multi-layer rare-earth-based superconducting wires provided with the superconducting current lead shown in FIG. 1.

For example, as the second example of a structure of the thin multi-layer rare-earth-based superconducting wire, as shown in FIG. 6A, the thin multi-layer rare-earth-based superconducting wire 40 can be used. The thin multi-layer rare-earth-based superconducting wires 40 has a structure in which a superconducting laminated body 37 is formed by laminating an intermediate layer 34, an oxidesuperconducting layer 35, and a protection layer 36 on a base material 33, a Cu rolling tape material 38 is attached and fixed to the superconducting laminated body 37, and the entire surface is further covered with a metal layer 39. The metal layer 39 can be formed by plating, attaching and fixing a metal tape and the like; however, the metal layer 39 is not limited to these methods.

Figure 6B:
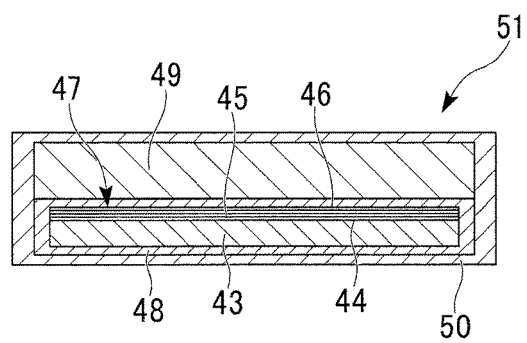
FIG. 6B is a partial cross-sectional view showing the third example of the thin multi-layer rare-earth-based superconducting wires provided with the superconducting current lead shown in FIG. 1.

In addition, as the third example of a structure of the thin multi-layer rare-earth-based superconducting wire, as shown in FIG. 6B, the thin multi-layer rare-earth-based superconducting wire 51 can be used. The thin multi-layer rare-earth-based superconducting wire 51 has a structure in which a superconducting laminated body 47 formed by laminating an intermediate layer 44, an oxidesuperconducting layer 45, and a protection layer 46 on a base material 43 is covered with a metal layer 48, a Cu rolling tape material 49 is attached and fixed thereto, and the entire surface thereof is further covered with a metal layer 50.

Figure 6C:
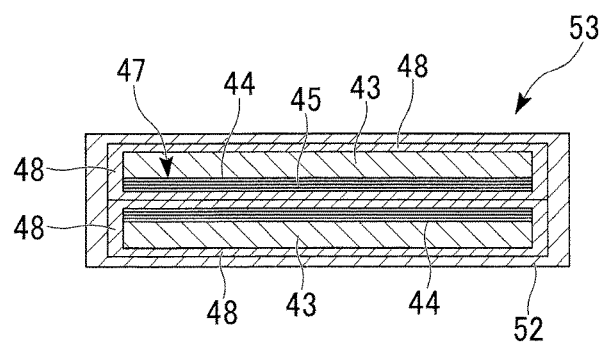
FIG. 6C is a partial cross-sectional view showing the fourth example of the thin multi-layer rare-earth-based superconducting wires provided with the superconducting current lead shown in FIG. 1.

Moreover, as the fourth example of a structure of the thin multi-layer rare-earth-based superconducting wire, as shown in FIG. 6C, the thin multi-layer rare-earth-based superconducting wire 53 can be used. The thin multi-layer rare-earth-based superconducting wire 53 has a structure in which two superconducting laminated bodies 47, each of the entire surface being covered with the metal layer 48, are faced and laminated, and the entire surface is further covered with a metal layer 52.

Figure 6D:
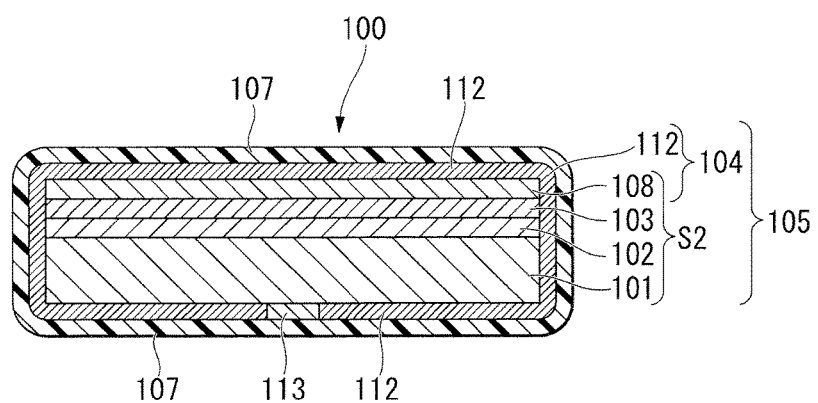
FIG. 6D is a partial cross-sectional view showing the fifth example of the thin multi-layer rare-earth-based superconducting wires provided with the superconducting current lead shown in FIG. 1.

Moreover, as the fifth example of a structure of the thin multi-layer rare-earth-based superconducting wire, a cross-sectional schematic view along with a width direction of a thin multi-layer rare-earth-based superconducting wire 100 is shown in FIG. 6D.

In the superconducting wire 100 shown in FIG. 6D, a laminate body S2 is formed by laminating an intermediate layer 102, an oxidesuperconducting layer 103, and the first stabilization layer 108 in this order on one surface of the base material 101 and has a rectangular cross-section. In addition, the superconducting laminated body 105 includes the laminate body S2 at a center portion, and is formed such that the second stabilization layer (a metal layer) 112 covers almost the entire outer surface of the laminate body S2, and has an approximate rectangular shape. Furthermore, the superconducting wire 100 is formed such that an insulation coating layer 107 covers an entire outer surface of the superconducting laminated body 105. The metal stabilization layer 104 is constituted by a first stabilization layer 108 formed on the oxidesuperconducting layer 103, and the second stabilization layer 112 which covers almost the entire outer surface of the laminate body S2.

The second stabilization layer 112 is formed by a metallic material with preferable conductivity. The second stabilization layer 112 acts together with the first stabilization layer 108 as a bypass through which the current is commuted when the oxide superconducting layer 103 transitions from a superconducting state to a non-superconducting state. Note that the metal tape-shaped second stabilization layer 112 is arranged along with an outer surface of the laminate body S2 so as to have approximately a C-shape cross-section and covers almost the entire surface of the laminate body S2. In particular, the second stabilization layer 112 is arranged so as to cover almost the entire surface of the laminate body S2 except for a center portion at the other surface (a surface where the intermediate layer 102 is not formed) of the base material 101. The portion, which is not covered with the second stabilization layer 112 at the center portion of the other surface of the base material 101, is covered with the solder layer 113 so as to fill in an concave portion between two edges of the second stabilization layer 112.

Regarding a metallic material constitutes the second stabilization layer 112, the metallic material that constitutes the second stabilization layer of the above-described thin multi-layer rare-earth-based superconducting wires can be applied, and regarding the thickness of the second stabilization layer 112, the same range of the thickness of the second stabilization layer can also be applied.

Although omitted in FIG. 6D, when the metal tape-shaped second stabilization layer 112 is integrated with the outer surface of the laminate body S2 via solder, a solder layer exists between the laminate body S2 and the second stabilization layer 112.

Figure 6E:
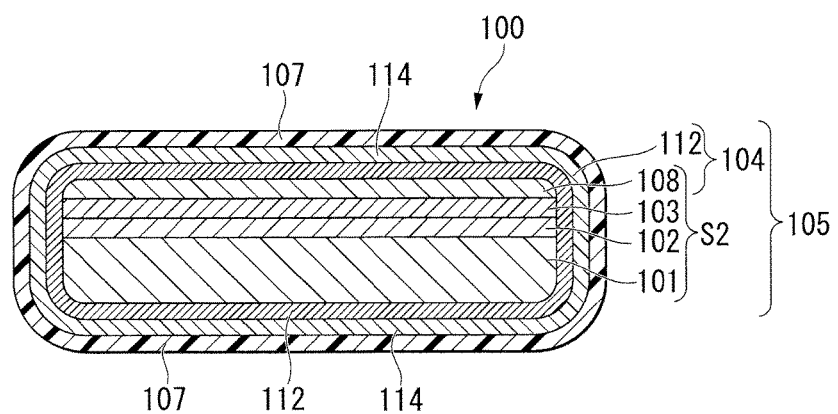
FIG. 6E is a partial cross-sectional view showing the sixth example of the thin multi-layer rare-earth-based superconducting wires provided with the superconducting current lead shown in FIG. 1.

Furthermore, as shown in FIG. 6E, on one surface or the both surfaces of the second stabilization layer 112, a solder layer (a conductive splicing layer) 114 such as Sn can be formed (plated). The solder layer 114 is also formed on an outside surface (an outer surface) of the second stabilization layer 112. Therefore, an electrode terminal can be directly connected without separately forming another solder layer and easily attached.

As described above, the structure of the thin multi-layer rare-earth-based superconducting wires applied to the superconducting current lead 1 of the embodiment of the present invention can be variously modified. Other than the structures shown in FIG. 1 and FIGS. 6A-6E, publicly known various structures of the rare-earth-based oxide superconducting wires can be applied.

EXAMPLES

An oxidesuperconducting laminated body is employed, in which on a surface of a tape-shaped base material formed by Hastelloy C276 (trade name registered to Hanes International of the U.S.) and having a width of 5 mm and a thickness of 0.1 mm, a diffusion prevention layer including $Al_2O_3$ and having a thickness of 100 nm, a bed layer including $Y_2O_3$ and having a thickness of 30 nm, an MgO orientation layer having a thickness of 10 nm formed by an ion beam assisted deposition method, a $CeO_2$ cap layer having a thickness of 500 nm, a $GdBa_2Cu_3O_{7-x}$ oxidesuperconducting layer having a thickness of approximately 2 μm, and an Ag protection layer having a thickness of 10 μm. With respect to the oxidesuperconducting laminated body, Oxygen annealing is performed at 500° C. By performing the Oxygen annealing, the thin multi-layer rare-earth-based superconducting wire is obtained.

With regard to the obtained thin multi-layer rare-earth-based superconducting wire, when a magnetic field of 0.5 T is applied to a main surface (a surface) while magnetic field applied angle is variously changed, the magnetic field applied angle dependence of the critical current is measured (i.e., a ratio when critical current of a 77T self-magnetic field being 0 is referred to as $Ic_0$). In addition, similarly, magnetic-field applied angle dependence of a critical current at a 1T magnetic field and magnetic-field applied angle dependence of a critical current at a 3T magnetic field are measured. These results are all shown in FIG. 7.

Figure 7:
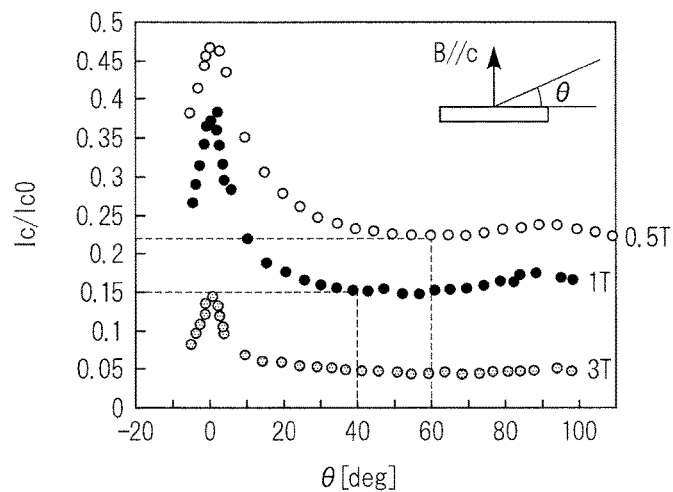
FIG. 7 is a graph showing dependence between the critical current and the magnetic field applied angle in thin multi-layer rare-earth-based superconducting wires.

As shown in FIG. 7, in any strength of the magnetic field, there exists opposing magnetic-field applied angle dependence. Based on the characteristics shown in FIG. 7, it is identified that when the magnetic field applied angle θ is 40-60 degrees with respect to the surface of the thin multi-layer rare-earth-based superconducting wires, the critical current value decreases the most.

Based on the results shown in FIG. 7, as an example of a superconducting current lead which is applied to the present high-temperature superconducting coil and is most likely to use, at the temperature of 77 K, the angle of arranging the thin multi-layer rare-earth-based superconducting wires when the magnetic field is 0.5 T, the number of the wires, and the ratio of (a worst value of the critical current)/(a standard value of the critical current) are calculated.

In the thin multi-layer rare-earth-based superconducting wires having the structure described above, a standard current value is 300 A/wire (a self-magnetic field state) for a wire having 10-mm width, and in the worst value at 77 K, one wire is arranged (i.e., two wires are arranged diagonally around the support rod) at the magnetic field applied angle where the critical current is most reduced. Critical current values of the remaining thin multi-layer rare-earth-based superconducting wires are calculated based on the magnetic field characteristics, a total amount of the critical current (=the allowable current) is calculated, and the valued are listed in Table 1 shown below.

Figure 8:
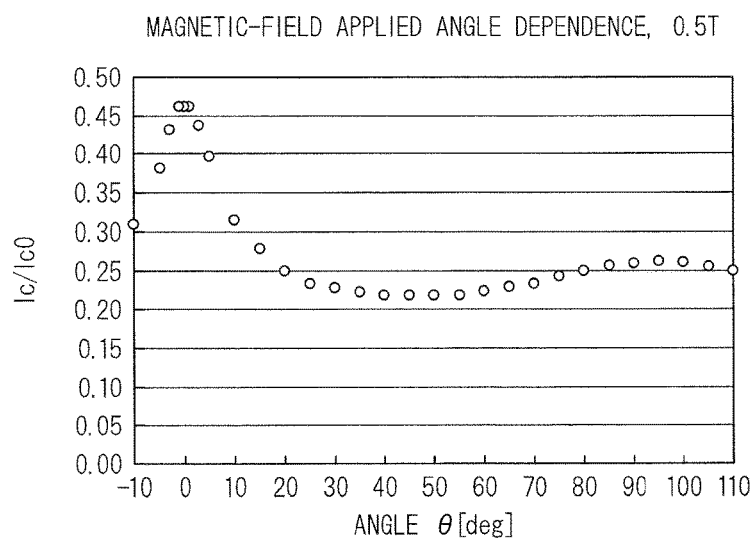
FIG. 8 is a graph showing magnetic-field applied angle dependence with respect to the critical current of the thin multi-layer rare-earth-based superconducting wires, which are used in the examples.
Figure 9:
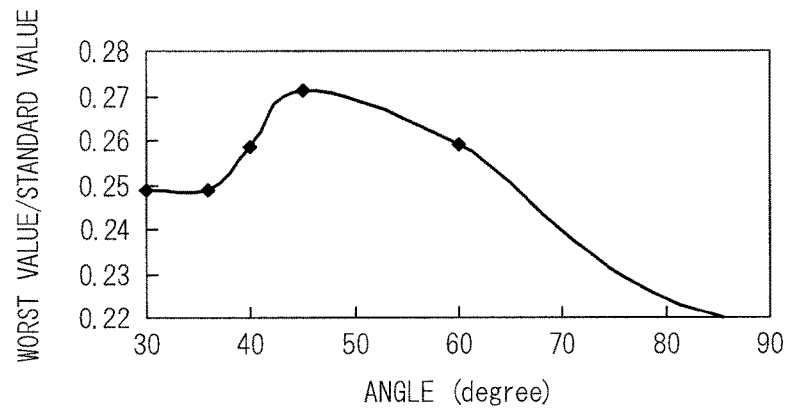
FIG. 9 is a graph showing positional angle dependence with respect to a value of (a worst value)/(a standard value) of the critical current of the thin multi-layer rare-earth-based superconducting wires, which are used in the examples.

As a basis of the calculation, as shown in FIG. 8, the magnetic-field applied angle dependence of the thin multi-layer rare-earth-based superconducting wires calculated when the magnetic field of 0.5 T is acted is used. In addition, the values shown in Table 1 are plotted in the graph as shown in FIG. 9.

TABLE 1

| Angle (θ) | Number of Wires | Standard Current Value (A) | Worst Value (A) | (Worst Value)/ (Standard Value) | Heat Penetration (ratio) |
|---|---|---|---|---|---|
| 180 | 2 | 600 | 130.2 | 0.217 | 1 |
| 90 | 4 | 1200 | 261 | 0.218 | 1.5 |

TABLE 1-continued

| Angle (θ) | Number of Wires | Standard Current Value (A) | Worst Value (A) | (Worst Value)/ (Standard Value) | Heat Penetration (ratio) |
|---|---|---|---|---|---|
| 60 | 6 | 1800 | 466.2 | 0.259 | 2 |
| 45 | 8 | 2400 | 650.4 | 0.271 | 2.5 |
| 40 | 9 | 2700 | 698.7 | 0.259 | 3 |
| 36 | 10 | 3000 | 745.8 | 0.249 | 3.5 |
| 30 | 12 | 3600 | 896.4 | 0.249 | 4 |

Based on the results shown in Table 1 and FIG. 8, the value of (the worst value)/(the standard value) increases within the range of angle θ of 40-60 degrees. Therefore, when the range of angle θ is 40-60 degrees, it is identified that the thin multi-layer rare-earth-based superconducting wires can be effectively used as a superconducting current lead.

Next, an estimation model of a heat conduction analysis is described that is a simplified relative comparison of the structure in which the thin multi-layer rare-earth-based superconducting wire according to the present invention is used for a superconducting current lead and a structure in which a generally known Ag-sheath-type Bi-based oxide superconducting wire is used for a superconducting current lead. Hereinafter, after setting a fundamental structure, estimation results in a one-dimensional heat transfer model are compared. The estimation results are based on a hypothetical simplified model. However, the simplified model is considered to be effective when the relative comparison is performed based on the superconducting current lead in which a Bi-based oxide superconducting wire closely similar to the thin multi-layer rare-earth-based superconducting wire is used.

<Estimation Conditions>

Figure 10:
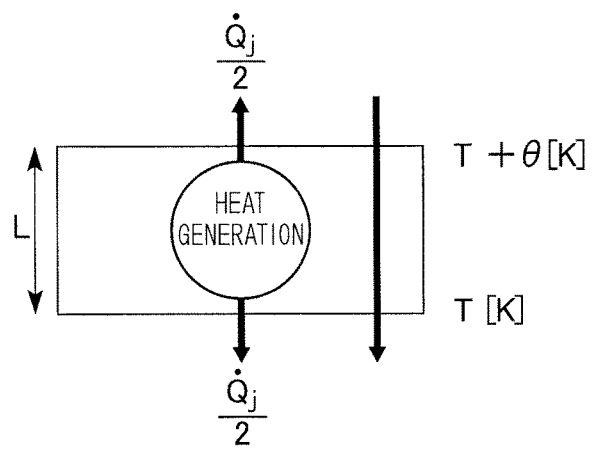
FIG. 10 is an explanatory diagram of a fine volume model which is used for performing a heat conduction analysis regarding the superconducting current lead according to the present invention.

In order to perform a heat conduction analysis, a fine volume model as shown in FIG. 10 is employed. A steady state (i.e., the time integration term equals to 0), heat-transfer coefficient k, and electric resistance are constant and unrelated to the temperature. Only the conduction cooling is assumed and the refrigerant cooling is not assumed. A thermal contact ratio among respective members is set to be zero, an end with a high temperature of the superconducting current lead at the outer container site is set to be 77 K, and an end with a low temperature of the superconducting current lead at an inside of the inner container is set to be 4.2 K. A copper terminal and a support rod of stainless steel are used as members of the estimation model described above. In addition, with regard to the thin multi-layer rare-earth-based superconducting wires, the base material is made of Hastelloy, the stabilization layer is made of Cu, and the outer body is a cover made of GFRP. The support rod of stainless steel, the thin multi-layer rare-earth-based superconducting wires, and the outer body made of GFRP equivalent circuit constitute an equivalent circuit.

When the current is injected to the superconducting current lead, the support rod of the superconducting current lead, the base material made of Hastelloy, and the stabilization layer generate a little heat since they have heat resistance.

A fine volume model of heat conduction of a conductor which is in the state described above is shown in FIG. 10. Here, regarding heat penetration $Q_c$, the relational expression of $Q_c = k \cdot S \cdot \theta / L + Q_j/2$ is satisfied, and regarding Joule heat $Q_j$, $Q_j = \rho \cdot I^2 \cdot L / S$ is satisfied, where k is thermal conductivity [W/(m·K)], S is an cross-sectional area [m$^2$], ρ is an electric resistivity [Ω·m], I is current [A], and L is a length [m].

Figure 11:
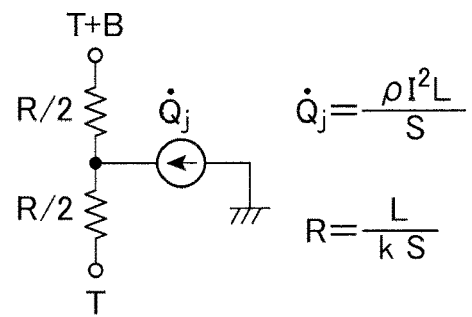
FIG. 11 is an equivalent circuit diagram of the fine volume model shown in FIG. 10.
Figure 12:
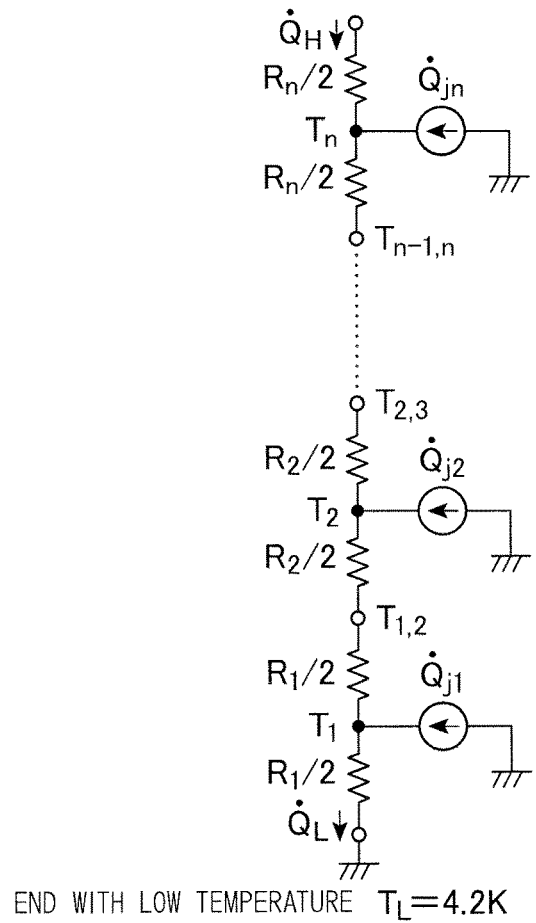
FIG. 12 is an equivalent circuit diagram in which the fine volume model shown in FIG. 10 is series-connected.

If the fine volume model shown in FIG. 10 is described as an equivalent circuit, the equivalent circuit is as shown in FIG. 11. When the equivalent circuit of FIG. 11 is applied to the structure where the two thin multi-layer rare-earth-based superconducting wires shown in FIG. 1 are attached, an equivalent circuit is formed as shown in FIG. 12.

Here, heat resistance is described as R=L/kS [K/W] and electric resistance is described as r=ρL/S [Ω]. Each parameter is cited from the literature (Y. Iwasa, Case Studies in Superconducting Magnets, P. 632-642, 2nd ed. Springer, 2009), as described below.

<Parameters of Y-Based Current Lead>

Electric resistivity ρ of copper (oxygen-free copper):
   at a high-temperature site, 2.0E-09 [Ω·m] (77 K); and
   at a low-temperature site, 5.0E-10 [Ω·m], (RRR=30.5 K), where RRR is residual resistance ratio.

Thermal conductivity k:
   copper (a high-temperature site), 500 [W/(m/K)] (77K);
   Hastelloy, 5 [W/(m/K)] (40K) (a base material of a superconducting wire);
   stainless steel, 5 [W/(m/K)] (40K) (a support rod);
   GFRP, 0.25 [W/(m/K)] (40K); and
   copper (a low-temperature site), 200 [W/(m/K)] (RRR=30, 5K).

A GFRP cover is arranged in parallel with wires (width of 10 mm, two wires) and a support rod made of stainless steel.
   Cross-sectional area of a copper wire: 4.00E-07 [m$^2$], length L=0.145 [m]
   Cross-sectional area of a Hastelloy portion of a wire: 2.00E-06 [m$^2$], length L=0.145 [m]
   Cross-sectional area of a support rod of stainless steel: 3.00E-05 [m$^2$], length L=0.145 [m]
   Cross-sectional area of GFRP: 1.07E-04 [m$^2$], length L=0.245 [m]

Heat Resistance R:
   heat resistance R of a copper portion of a wire: 725 [K/W];
   heat resistance R of a Hastelloy portion of a wire: 14500 [K/W];
   heat resistance R of a support rod of stainless steel: 967 [K/W]; and
   heat resistance R of an outer body made of GFRP: 9175 [K/W].

Solder connection resistance between a wire and a copper terminal:
   high-temperature site: 1.00E-07 [Ω·m](77K); and
   low-temperature site: 1.00E-08 [Ω·m] (4K).

<Bi-Based Current Lead Setting Parameters>

Thermal conductivity k of Ag: 1500 [W(m·K)] (40K).
Cross-sectional area of Ag: 5.76E-0.6 [m$^2$], length L=0.228 [m]
   (width: 4 mm, two wires arranged in parallel×6=12 wires, silver ratio: 1.5).
GFRP cross-sectional area: 2.84E-0.4 [m$^2$], length L=0.245 [m]
   (a solid structure, note that an internal area of a wire is excluded.)
Heat resistance R of Ag: 79 [K/W], and
GFRP heat resistance: 3456 [K/W].

Based on the parameters described above, regarding the superconducting current lead including the thin multi-layer rare-earth-based superconducting wires and the superconducting current lead including the Bi-based oxide superconducting wires, heat penetration at each low-temperature end are calculated and compared.

In the thin multi-layer rare-earth-based superconducting wires, a model structures shown in FIGS. 10-12 is fabricated using a base material made of Hastelloy having the thickness of 0.1 mm, a stabilized copper layer of cupper plating, and a superconducting wire having a wire width of 10 mm. Here, the end with high temperature has 77 K and the end with low temperature has 4.2 K. The heat-penetration estimation value when the Bi-based superconducting wire (silver ratio 1.5, 0.23 mm, a width of 4.4 mm, 77 K, and 12 wires are used in order to satisfy critical current of 1000 A in a self-magnetic field) is used as the superconducting current lead is set to be 1.0, and the value is compared with a value of the model structure. In the superconducting current lead using the thin multi-layer rare-earth-based superconducting wires, the calculation results of a copper plate thickness and a heat penetration relative value are shown in Table 2.

TABLE 2

| Thickness of Stabilized Copper ($\mu m$) | Current: 0 A | Current: 600 A |
|---|---|---|
| 20 | 0.31 | 0.41 |
| 25 | 0.36 | 0.46 |
| 33 | 0.49 | 0.58 |
| 50 | 0.62 | 0.70 |
| 80 | — | 1.0 |
| Bi-base (silver ratio: 1.5) | 1.0 | 1.0 |

Based on the results shown in Table 2, comparing to the structure of the superconducting current lead using the Bi-based oxide superconducting wires, it is effective to set the thickness of stabilized copper to be less than 80 $\mu m$ in order to reduce heat penetration at the lower-temperature end. It is identified that the thinner the thickness of stabilized copper, the lesser heat penetration at the lower-temperature end of the superconducting current lead.

It is described that the support rod is made of stainless steel, and the outer body is made of GFRP and has the thickness of 2 mm. However, even when the outer body is made of stainless steel, the results shown in Table 2 are the same.

In addition, if the stabilized copper does not have a certain thickness, there appears a pin-hole issue, and due to moisture intrusion, the superconducting characteristic may be deteriorated. Therefore, if the thickness of stabilized copper is 1 $\mu m$ or more, it is possible to perform the processing treatment; however, the thickness is more preferable to be approximately 20 $\mu m$.

The present invention can be applied to a superconducting current lead, a superconducting current lead device, and a superconducting magnet device, which are utilized for a superconducting magnet or a superconducting device.

What is claimed is:
1. A superconducting current lead supplying current to a superconducting device comprising:
a plurality of electrode members;
a support rod that is arranged between the plurality of electrode members so as to connect the plurality of electrode members each other;
a plurality of thin multi-layer rare-earth-based superconducting wires, each of which comprises a main surface and both end portions being connected to each of the plurality of electrode members, and each of which is arranged on an outer surface of the support rod and has a tape shape, wherein an angle θ is 40-60 degrees that is formed by each of the main surfaces adjacent to each other in a circumferential direction of the support rod on the outer surface of the support rod, wherein:
a cross-section of the support rod comprises a multangular shape comprising three or more attachment surfaces on an outer circumferential of the support rod, and among the three or more attachment surfaces, each of the plurality of thin multi-layer rare-earth-based superconducting wires is arranged at at least each of two of the attachment surfaces;
each of the plurality of thin multi-layer rare-earth-based superconducting wires comprises
a laminated body in which an intermediate layer, an oxide superconducting layer, and a first stabilization layer are laminated on a base material;
a second stabilization layer which covers an entire surface of the laminated body;
the second stabilization layer is formed of Cu;
a thickness of the second stabilization layer is 20 $\mu m$ or more and 80 $\mu m$ or less; and
a solder layer is formed on one surface or both surfaces of the second stabilization layer.

2. The superconducting current lead according to claim 1, wherein
each of the plurality of thin multi-layer rare-earth-based superconducting wires is arranged along with the attachment surface such that a distance between the base material and the attachment surface is greater than a distance between the first stabilization layer and the attachment surface.

3. A superconducting current lead device comprising:
the superconducting current lead according to claim 1, wherein a first electrode member is connected to a first electrode terminal and a second electrode member is connected to a second electrode terminal; and
an outer body attached to the first electrode terminal and the second electrode terminal and surrounding the superconducting current lead.

4. A superconducting magnet device comprising:
an outer container capable of reducing pressure;
a low-temperature-site shield container arranged inside the outer container;
a high-temperature superconducting coil accommodated inside the low-temperature-site shield container;
a refrigerator attached to the outer container; and
a superconducting current lead device according to claim 3 arranged inside the outer container and supplying current from an external power source to the high-temperature superconducting coil.

* * * * *